(12) United States Patent
Suga

(10) Patent No.: US 6,344,248 B1
(45) Date of Patent: Feb. 5, 2002

(54) LIGHT-BLOCKING ANISOTROPICALLY ELECTROCONDUCTIVE ADHESIVE FILM, AND LIQUID CRYSTAL DISPLAY DEVICE

(75) Inventor: Yasuhiro Suga, Kanuma (JP)

(73) Assignee: Sony Chemicals Corp., Tokyo (JP)

(*) Notice: Subject to any disclaimer, the term of this patent is extended or adjusted under 35 U.S.C. 154(b) by 0 days.

(21) Appl. No.: 09/413,491

(22) Filed: Oct. 6, 1999

(30) Foreign Application Priority Data

Oct. 12, 1998 (JP) .............................. 10-289590

(51) Int. Cl.⁷ .............................. G02F 1/1345
(52) U.S. Cl. ................... 428/1.5; 252/502; 252/508; 252/500; 428/355 R; 428/323
(58) Field of Search ................ 428/1.5, 323, 355 R, 428/356; 349/122; 252/500, 502, 510, 508

(56) References Cited

U.S. PATENT DOCUMENTS 5,336,443 A  8/1994  Odashima
5,545,281 A * 8/1996  Matsui et al. ............ 156/273.7

FOREIGN PATENT DOCUMENTS

| EP | 0099228 | 1/1984 |
| JP | 01113480 | 5/1989 |
| JP | A-7-225391 | 8/1995 |

* cited by examiner

Primary Examiner—Alexander S. Thomas

(57) ABSTRACT

A light-blocking anisotorpically electroconductive adhesive film comprises electroconductive particles and a light-blocking material dispersed in an insulating adhesive agent. The light-blocking material is carbon, an inorganic filler, or a mixture of these.

4 Claims, 1 Drawing Sheet

LIGHT-BLOCKING ANISOTROPICALLY ELECTROCONDUCTIVE ADHESIVE FILM, AND LIQUID CRYSTAL DISPLAY DEVICE

BACKGROUND OF THE INVENTION

1. Field of the Invention

The present invention relates to a light-blocking anisotropically electroconductive adhesive film, and to a liquid crystal display device that makes use of the same.

2. Description of the Related Art

The use of liquid crystal display devices as display means for personal computers and the like is becoming increasingly common in recent years, and the use of active matrix type liquid crystal display devices that make use of thin film transistors (TFT) as switching elements is particularly widespread.

As shown in FIG. 1, these active matrix type liquid crystal display devices generally have a COG (Chip On Glass) structure comprising a liquid crystal cell 4 in which a liquid crystal 3 is sealed between a pair of transparent substrates 1 and 2, and a liquid crystal drive-use semiconductor device 5 (such as a LSI chip) connected to the patterned electrodes (not shown) of the substrate 1. The liquid crystal drive-use semiconductor device 5 is connected to an external power source circuit (not shown) by a flat cable 6. Here, the liquid crystal drive-use semiconductor device 5 is connected to the patterned electrodes of the substrate 1 via an anisotropically electroconductive adhesive agent 7' comprising electroconductive particles dispersed in an insulating adhesive agent, and a backlight (not shown) is disposed on the back surface 1a side of the substrate 1.

With conventional liquid crystal display devices, however, the liquid crystal drive-use semiconductor device 5 generally has an Si-COMOS structure having photoelectric effect characteristics, and therefore when high-energy light is incident on the liquid crystal drive-use semiconductor device 5, leakage of the signal charge may occur, causing a malfunction of the liquid crystal drive-use semiconductor device 5 and resulting in display defects such as illegal characters, missing characters in the display. The light from the backlight is particularly prone to causing malfunction of the liquid crystal drive-use semiconductor device 5.

Consequently, a light-blocking tape (not shown) has been applied to the back surface 1a of the substrate 1 in order to prevent light (particularly the light from the backlight) from being incident on the liquid crystal drive-use semiconductor device 5 from the back surface 1a of the substrate 1. It has also been proposed that, as an anisotropically electroconductive adhesive agent in the connection of the liquid crystal drive-use semiconductor device 5 to the patterned electrodes of the substrate 1, there is used a dispersion in which electroconductive particles are dispersed in a light-blocking adhesive resin produced by adding a black dye to an insulating adhesive agent (Japanese Patent Application Laid-Open No.07-225391).

However, there is a problem that, when a light-blocking tape is applied to the back surface 1a of the substrate 1, the tact time lengthens and the cost of manufacturing a liquid crystal display device also increases.

Also, although the problems of longer tact time and higher manufacturing costs are improved when a dispersion of electroconductive particles in a light-blocking adhesive resin is used as an anisotropically electroconductive adhesive agent, there remains another problem that the light-blocking effect is insufficiently.

SUMMARY OF THE INVENTION

The present invention was conceived in order to solve the above problems of prior art, and an object thereof is to prevent the leakage of signal charges and the malfunction of a liquid crystal drive-use semiconductor device, and to prevent display defects such as illegal characters, missing characters in the display, without lengthening the tact time or increasing the cost of manufacturing the liquid crystal display device, even when the liquid crystal drive-use semiconductor device of the liquid crystal display device is irradiated with high-energy light (particularly light from a backlight).

The inventor perfected the present invention upon discovering that the stated object could be achieved, in the disposition of a liquid crystal drive-use semiconductor device on the transparent substrate of a liquid crystal display device, by using a light-blocking anisotropically electroconductive adhesive film produced by dispersing electroconductive particles and a light-blocking material such as carbon, an inorganic filler or a mixture of these in an insulating adhesive agent, and then forming this dispersion into a film.

Specifically, the present invention provides a light-blocking anisotropically electroconductive adhesive film comprising electroconductive particles and a light-blocking material dispersed in an insulating adhesive agent, wherein the light-blocking material is carbon, an inorganic filler, or a mixture of these.

The present invention also provides a liquid crystal display device comprising a liquid crystal cell in which a liquid crystal is sealed between a pair of substrates, and a liquid crystal drive-use semiconductor device connected to the patterned electrodes of one of the substrates, wherein the liquid crystal drive-use semiconductor device is connected to the patterned electrodes of one of the substrates via the above-mentioned light-blocking anisotropically electroconductive adhesive film.

This and other objects, features and advantages of the present invention are described in or will become apparent from the following detailed description of the invention.

DESCRIPTION OF THE PREFERRED EMBODIMENTS

Figure 1:
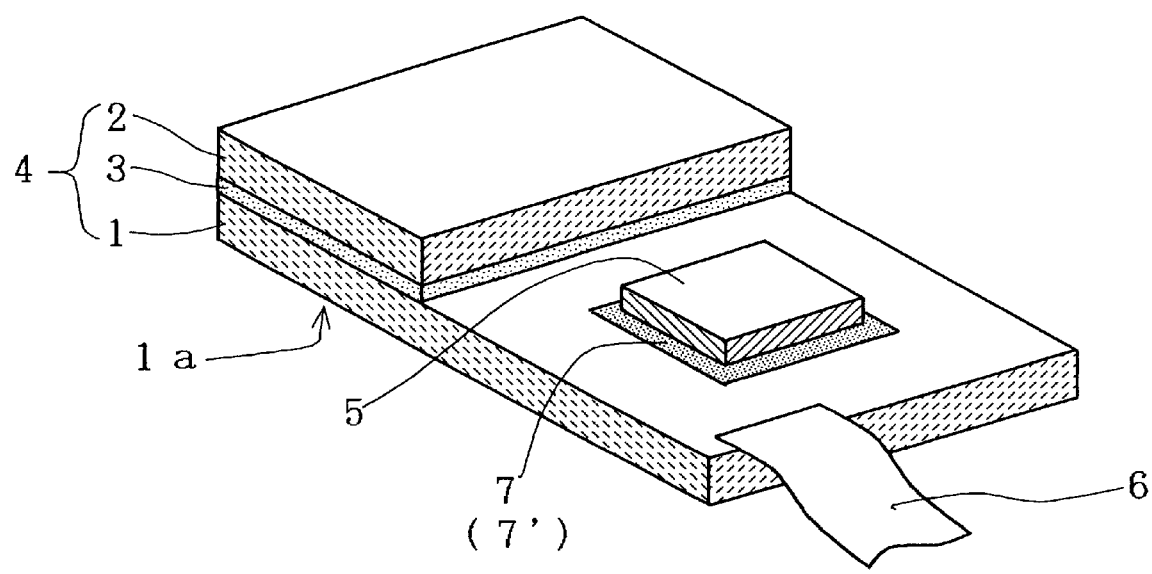
FIG. 1 is a simplified oblique view of a liquid crystal display device.

The light-blocking anisotropically electroconductive adhesive film of the present invention will now be described in detail.

The light-blocking anisotropically electroconductive adhesive film of the present invention is produced by dispersing electroconductive particles and a light-blocking material in an insulating adhesive agent, and then forming this dispersion into a film. A readily available, inexpensive, and light-absorbing or light-scattering carbon, inorganic filler, or mixture of these is used as the light-blocking material.

Therefore, the light-blocking anisotropically electroconductive adhesive film of the present invention allows lower optical transmissivity to be achieved by absorbing or scattering any light that enters from the outside. Thus, if the light-blocking anisotropically electroconductive adhesive film of the present invention is used in the disposition of a liquid crystal drive-use semiconductor device in a liquid crystal display device, the incidence of light from a backlight into a liquid crystal drive-use semiconductor device can be greatly suppressed without lengthening the tact time nor increasing the cost of manufacturing the liquid crystal display device. Accordingly, the leakage of signal charges and the malfunction of the liquid crystal drive-use semiconductor device will be extremely unlikely to occur, and display defects such as illegal characters, missing characters in the display can be significantly suppressed.

The cost of obtaining the carbon that is used as the light-blocking material will be higher if the particle diameter thereof is too small, and the anisotropically electroconductive adhesive film will become isotropically electroconductive if the diameter is too large, so this diameter is preferably 0.05 to 1 μm, and more preferably 0.1 to 0.5 μm.

Not enough light will be absorbed if the carbon is contained in too small an amount in the light-blocking anisotropically electroconductive adhesive film, and the anisotropically electroconductive adhesive film will become isotropically electroconductive if the amount is too large, so this amount is preferably 0.01 to 10 wt %, and more preferably 0.1 to 10 wt %.

The cost of obtaining the inorganic filler selected from among silica, alumina, and a mixture of these that is used as the light-blocking material will be higher if the particle diameter thereof is too small, and it will become foreign matter that impairs electroconductivity if the diameter is too large, so this diameter is preferably 0.1 to 20 μm, and more preferably 0.2 to 4 μm.

Not enough light will be scattered if the inorganic filler is contained in too small an amount in the light-blocking anisotropically electroconductive adhesive film, and film strength will decrease if the amount is too large, so this amount is preferably 5 to 70 wt %, and more preferably 20 to 50 wt %.

A mixture of carbon and an inorganic filler may also be used as the light-blocking material in the present invention.

The insulating adhesive agent can be any insulating adhesive agent used in conventional anisotropically electroconductive adhesive films, such as a mixture of an epoxy resin, a latent curing agent, and a silane coupling agent.

Similarly, the electroconductive particles can be any electroconductive particles used in conventional anisotropically electroconductive adhesive films, such as polystyrene particles plated with gold or nickel. The size of these particles may be suitably selected.

When the light-blocking anisotropically electroconductive adhesive film is used for a liquid crystal display device, the thickness of this film is usually 10 to 40 μm, and preferably 15 to 30 μm.

The light-blocking capability of the light-blocking anisotropically electroconductive adhesive film of the present invention is preferably such that the optical transmissivity is no more than 50% in the wavelength region where there is a possibility of an adverse effect on a semiconductor device, that is, a wavelength region of 300 to 1100 nm. Display problems will tend to occur if 50% is exceeded.

The light-blocking anisotropically electroconductive adhesive film of the present invention can be manufactured by mixing electroconductive particles, a light-blocking material, and, if needed, a solvent into an insulating adhesive agent and forming a film by a conventional method.

The light-blocking anisotropically electroconductive adhesive film of the present invention can be used in the same applications as conventional anisotropically electroconductive adhesive films. In view of the light-blocking performance thereof, it can be preferably used in the disposition of a liquid crystal drive-use semiconductor device on a transparent substrate in a liquid crystal display device.

This liquid crystal display device, similarly to the conventional liquid crystal display device shown in FIG. 1, comprises a liquid crystal cell 4 in which a liquid crystal 3 is sealed between a pair of transparent substrates 1 and 2, and a liquid crystal drive-use semiconductor device 5 (such as a LSI chip) connected to the patterned electrodes (not shown) of the substrate 1. Here, the liquid crystal drive-use semiconductor device 5 is connected to an external power source circuit (not shown) by a flat cable 6, and the liquid crystal drive-use semiconductor device 5 is also connected to the patterned electrodes of the substrate 1 via the above-mentioned light-blocking anisotropically electroconductive adhesive film 7 of the present invention comprising electroconductive particles dispersed in an insulating adhesive agent. A backlight (not shown) is disposed on the back surface 1a side of the substrate 1.

With this liquid crystal display device, because the light-blocking anisotropically electroconductive adhesive film of the present invention is used in the disposition of the liquid crystal drive-use semiconductor device, the incidence of light, particularly from the backlight, into the liquid crystal drive-use semiconductor device can be greatly suppressed without lengthening the tact time nor increasing the cost of manufacturing the liquid crystal display device. Therefore, the leakage of signal charges and the malfunction of the liquid crystal drive-use semiconductor device will be extremely unlikely to occur, and display defects such as illegal characters, missing characters in the display.

EXAMPLES

The present invention will now be described in more detail through working examples.

Working Exs. 1 to 7 and Comparative Exs. 1 and 2

An epoxy resin, a latent curing agent, a silane coupling agent, electroconductive particles, and a light-blocking material were mixed by a conventional method according to the formulations shown in Table 1. Each mixture was formed into a film with a thickness of 25 μm on a polyethylene terephthalate substrate to produce a light-blocking anisotropically electroconductive adhesive film.

TABLE 1

| | Working Examples | | | | | | | Comp. Ex. (weight parts) | |
|---|---|---|---|---|---|---|---|---|---|
| Components | 1 | 2 | 3 | 4 | 5 | 6 | 7 | 1 | 2 |
| Epoxy resin*1 | 36 | ← | ← | ← | ← | ← | ← | ← | ← |
| Latent curing agent*2 | 61 | ← | ← | ← | ← | ← | ← | ← | ← |
| Silane coupling agent*3 | 1 | ← | ← | ← | ← | ← | ← | ← | ← |
| Conductive particles*4 | 14 | ← | ← | ← | ← | ← | ← | ← | ← |
| Light-blocking material | | | | | | | | | |
| Black dye*5 | — | — | — | — | — | — | — | — | 0.7 |
| Silica*6 | 30 | 50 | — | — | — | 30 | — | — | — |
| Silica*7 | — | — | 30 | — | — | — | — | — | — |
| Carbon*8 | — | — | — | 0.36 | 0.7 | 0.5 | — | — | — |
| Alumina*9 | — | — | — | — | — | — | 30 | — | — |

Table notes:
*1: Epikote 1009, made by Yuka Shell
*2: Novacure HX3941HP, made by Asahi Chemical Industry
*3: A-187, made by Nippon Unicar TABLE 1-continued

|  | Working Examples | | | | | | | Comp. Ex. (weight parts) | |
|---|---|---|---|---|---|---|---|---|---|
| Components | 1 | 2 | 3 | 4 | 5 | 6 | 7 | 1 | 2 |

*4: Benzoguanamine resin particles plated with Ni/Au (5 μm diameter), made by Nihon Kagaku Kogyo
*5: Sumilite Black G conc., made by Sumitomo Chemical
*6: Spherical silica with 0.2 to 2 μm diameter, made by Ube Nitto Kasei
*7: Powdered silica with 4 μm diameter or smaller, made by Ube Nitto Kasei
*8: SD-426-B (0.22 μm diameter), made by Resinocolor Kogyo
*9: Spherical alumina with 0.2 to 2 μm diameter, made by Dowa Mining Evaluation The light-blocking anisotropically electroconductive adhesive films thus obtained were evaluated for their "light-blocking effect (critical illuminance)," "optical transmissivity," "conduction resistance," and "insulation resistance" as described below. The evaluation results are given in Table 2.

Light-blocking Effect (Critical Illuminance)

Liquid crystal display devices such as that shown in FIG. 1 were produced using the light-blocking anisotropically electroconductive adhesive films obtained above. The substrate 1a side (backlight side) was irradiated with light (2000 to 20,000 Lx) from an incandescent light bulb (radiation wavelength region: 450 to 970 nm), and the critical illuminance (the illuminance at the point when a decrease in contrast or a defective display visually appeared on the display surface) was observed.

The symbol "○" indicates that the critical illuminance value thus obtained was greater than the critical illuminance (20,000 Lx) of an ordinary liquid crystal display device featuring a light-blocking tape, while the symbol "x" indicates a value under 10,000. The symbol "Δ" indicates a value somewhere in between these.

Optical Transmissivity

The light-blocking anisotropically electroconductive adhesive film was sandwiched between a pair of transparent glass substrates with a thickness of 1.1 mm and then cured by heating, which yielded a sample for measuring optical transmissivity. The film thickness after curing was 16±1 mm.

This sample thus obtained was irradiated with light from a halogen lamp that emitted light in the 300 to 1100 nm wavelength region, and the optical transmissivity at a wavelength of 1100 nm was measured with a visible UV spectrophotometer (MCPD-100, made by Otsuka Electronic).

Conduction Resistance

A sample for measuring conduction resistance was produced by using a light-blocking anisotropically electroconductive adhesive film to join a liquid crystal drive-use IC (size: 0.55 mm thick×2 mm wide×20 mm long) provided with bumps 50×150 μm in size at a pitch of 80 μm onto an indium-tin composite oxide electrode of 10 Ω/□ formed on a glass substrate. The sample thus as put in a thermohygrostatic chamber at 85° C. and 85% RH, and the conduction resistance after 1000 hours was measured by four probe method.

The symbol "○" indicates that the conduction resistance value thus obtained was less than 50 Ω, while the symbol "x" indicates a value of 50 Ω or higher.

Insulation Resistance

A voltage of 20 V was applied between two adjacent probes in the above-mentioned conductive measurement sample (immediately after it was produced), and the insulation resistance at that point was measured.

The symbol "○" indicates that the insulation resistance value thus obtained was $10^8$ Ω or higher, while an "x" indicates a value of less than $10^8$ Ω.

TABLE 2

|  | Critical illuminance (Lx) | Evaluation | Optical transmissivity (%) | Conduction resistance | Insulation resistance |
|---|---|---|---|---|---|
| W. E. 1 | >20,000 | ○ | 42 | ○ | ○ |
| 2 | >20,000 | ○ | 45 | ○ | ○ |
| 3 | >20,000 | ○ | 41 | ○ | ○ |
| 4 | >20,000 | ○ | 47 | ○ | ○ |
| 5 | 15,000 | Δ | 32 | ○ | ○ |
| 6 | >20,000 | ○ | 34 | ○ | ○ |
| 7 | >20,000 | ○ | 40 | ○ | ○ |
| C. E. 1 | 4000 | X | 70 | ○ | ○ |
| C. E. 2 | 5000 | X | 60 | ○ | ○ |

[W. E.: Working Example; C. E.: Comparative Example]

It can be seen from the results in Table 2 that the light-blocking anisotropically electroconductive adhesive films of the present invention in Working Examples 1 to 7 exhibit better light-blocking than the anisotropically electroconductive adhesive film in which no light-blocking material was used (Comparative Example 1) and the light-blocking anisotropically electroconductive adhesive film in which a black dye was used as the light-blocking material (Comparative Example 2).

The present invention makes it possible to prevent the leakage of signal charges and the malfunction of a liquid crystal drive-use semiconductor device, and to prevent display defects such as illegal characters, missing characters in the display, without lengthening tact time nor increasing the cost of manufacturing the liquid crystal display device, even when high-energy light (particularly light from a backlight) being incident into on the liquid crystal drive-use semiconductor device of the liquid crystal display device.

The entire disclosure of the specification, claims, summary and drawings of Japanese Patent Application No. 10-289590 filed on Oct. 12, 1998 is herein incorporated by reference.

What is claimed is:

1. A light blocking anisotropically electroconductive adhesive film comprising electroconductive particles and a light-blocking material dispersed in an insulating adhesive agent, wherein the light-blocking material is a mixture of carbon with a particle diameter of 0.05 to 1 μm and an inorganic filler selected from among silica, alumina, and a mixture of these, having a particle diameter of 0.1 to 20 μm; wherein the carbon constitutes 0.01 to 10 wt % of the light-blocking anisotropically electroconductive adhesive film and wherein the inorganic filler constitutes 5 to 70 wt % of the light-blocking anisotropically electroconductive adhesive film.

2. A light blocking anisotropically electroconductive adhesive film comprising electroconductive particles and a light-blocking material dispersed in an insulating adhesive agent, wherein the light-blocking material is an inorganic filler selected from the group consisting of silica, alumina, and mixtures thereof; wherein the inorganic filler has a particle diameter of 0.1 to 20 μm; and wherein the inorganic filler constitutes 5 to 70 wt % of the light-blocking anisotropically electroconductive adhesive film.

3. A light-blocking anisotropically electroconductive adhesive film comprising electroconductive particles and a light-blocking material dispersed in an insulating adhesive agent; wherein the light-blocking material is carbon with a particle diameter of 0.05 to 1 μm; wherein the carbon light-blocking material constitutes 0.01 to 10 wt % of the anisotropically electroconductive adhesive film; and wherein the optical transmissivity in the wavelength region of 300 to 1100 nm is no more than 50%.

4. A liquid crystal display device comprising a liquid crystal cell in which a liquid crystal is sealed between a pair of substrates, and a liquid crystal drive-use semiconductor device connected to the patterned electrodes of one of the substrates, wherein the liquid crystal drive-use semiconductor device is connected to the patterned electrodes of one of the substrates via a light-blocking anisotropically electroconductive adhesive film comprising electroconductive particles and a light-blocking material dispersed in an insulating adhesive agent; wherein the light-blocking material is carbon with a particle diameter of 0.05 to 1 μm; and wherein the carbon light-blocking material constitutes 0.01 to 10 wt % of the anisotropically electroconductive adhesive film.

* * * * *